United States Patent
Halbritter et al.

(10) Patent No.: US 12,463,186 B2
(45) Date of Patent: Nov. 4, 2025

(54) METHOD FOR PRODUCING A RADIATION-EMITTING SEMICONDUCTOR CHIP, AND RADIATION-EMITTING SEMICONDUCTOR CHIP

(71) Applicant: ams-OSRAM International GmbH, Regensburg (DE)

(72) Inventors: Hubert Halbritter, Dietfurt-Toeging (DE); Bruno Jentzsch, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 401 days.

(21) Appl. No.: 18/042,621

(22) PCT Filed: Aug. 20, 2021

(86) PCT No.: PCT/EP2021/073139
§ 371 (c)(1),
(2) Date: Feb. 23, 2023

(87) PCT Pub. No.: WO2022/043211
PCT Pub. Date: Mar. 3, 2022

(65) Prior Publication Data
US 2023/0361090 A1    Nov. 9, 2023

(30) Foreign Application Priority Data

Aug. 25, 2020 (DE) .......................... 102020122210.6

(51) Int. Cl.
*H01L 25/075*    (2006.01)
*H01S 5/185*    (2021.01)
(Continued)

(52) U.S. Cl.
CPC .......... *H01L 25/0753* (2013.01); *H01S 5/185* (2021.01); *H10H 20/042* (2025.01); *H10H 20/856* (2025.01); *H10H 20/0363* (2025.01)

(58) Field of Classification Search
CPC ................. H01L 25/0753; H01S 5/185; H01S 2301/176; H01S 5/02255; H01S 5/0287;
(Continued)

(56) References Cited

U.S. PATENT DOCUMENTS

| | | | |
|---|---|---|---|
| 4,633,476 A * | 12/1986 | Scifres | B82Y 20/00 372/50.1 |
| 5,253,263 A | 10/1993 | Jansen et al. | |
| 5,498,883 A | 3/1996 | Lebby et al. | |
| 5,606,181 A | 2/1997 | Sakuma et al. | |
| 2010/0237358 A1 | 9/2010 | Nishida | |

FOREIGN PATENT DOCUMENTS

| | | |
|---|---|---|
| DE | 102019100532 A1 | 7/2020 |
| EP | 0582078 A1 | 2/1994 |

(Continued)

OTHER PUBLICATIONS

Hiramatsu, K.: "Epitaxial lateral overgrowth techniques used in group III nitride epitaxy" Journal of Physics: Condensed Matter, vol. 13, No. 32, 6961, Jul. 26, 2001.
(Continued)

*Primary Examiner* — Thanh Y. Tran
(74) *Attorney, Agent, or Firm* — MH2 Technology Law Group LLP (57) ABSTRACT

Disclosed is a method for producing a radiation-emitting semiconductor chip including the steps: —providing a semiconductor layer sequence having an active region which is designed for generating electromagnetic radiation, —producing a first recess in the semiconductor layer sequence, which fully penetrates the active region, —producing a first structure in the first recess, wherein—at least a lateral surface of the first structure facing the active region extends
(Continued)

obliquely to at least a first lateral surface of the semiconductor layer sequence, and—the first structure is spaced apart in lateral directions from the active region. Also disclosed is a radiation-emitting semiconductor chip.

19 Claims, 8 Drawing Sheets

(51) Int. Cl.
*H10H 20/00* (2025.01)
*H10H 20/856* (2025.01)
*H10H 20/01* (2025.01)

(58) Field of Classification Search
CPC ............ H01S 5/32341; H01S 2304/12; H10H 20/042; H10H 20/856; H10H 20/0363; H10H 20/034; H10H 20/841; H10H 20/01
See application file for complete search history.

(56) References Cited

FOREIGN PATENT DOCUMENTS

EP 2043210 A2 4/2009
JP H03196006 A 8/1991

OTHER PUBLICATIONS

Donnelly et al., Monolithic Two-Dimensional Surface Emitting Arrays of GaAs/AlGaAs Diode Lasers, Lasers and Electro-Optics Society Annual Meeting Conference Proceedings, Nov. 2-4, 1988, 4 pages.
International Search Report and Written Opinion dated Dec. 6, 2021, PCT Application No. PCT/EP2021/073139, 18 pages.
German Search Report dated Oct. 29, 2020, DE Application No. 10 2020 122 210.6, 7 pages.
German Search Report issued in corresponding German Patent Application No. 10 2020 122 210.6, dated Jul. 2, 2025, with English language translation, 14 pages.

* cited by examiner

METHOD FOR PRODUCING A RADIATION-EMITTING SEMICONDUCTOR CHIP, AND RADIATION-EMITTING SEMICONDUCTOR CHIP

CROSS-REFERENCE TO RELATED APPLICATIONS

This patent application is a national stage entry from International Application No. PCT/EP2021/073139, filed on Aug. 20, 2021, published as International Publication No. WO 2022/043211 A1 on Mar. 3, 2022, and claims priority to German patent application 10 2020 122 210.6, filed Aug. 25, 2020, the entire contents of all of which are incorporated by reference herein.

FIELD

A method for producing a radiation-emitting semiconductor chip is specified. Furthermore, a radiation-emitting semiconductor chip is specified.

BACKGROUND

One object to be achieved is to specify a method for producing a radiation-emitting semiconductor chip, which can be monitored particularly easily and is cost effective. A further object to be achieved is to specify such a radiation-emitting semiconductor chip.

SUMMARY

According to at least one embodiment of the method, a semiconductor layer sequence is provided, comprising an active area designed to generate electromagnetic radiation. The radiation-emitting semiconductor chip is designed, for example, to generate near ultraviolet radiation, visible radiation, and/or near infrared radiation in operation. The visible radiation is, for example, light of blue, green, yellow, or red color.

The semiconductor layer sequence is applied, for example, epitaxially to a growth substrate. The growth substrate is, for example, a GaN substrate.

The semiconductor layer sequence is based, for example, on a III-V compound semiconductor material. The III-V compound semiconductor material is, for example, a nitride compound semiconductor material. In this case, the compound semiconductor material comprises GaN.

The active area includes, for generating the electromagnetic radiation, for example, a pn transition, a double hetero structure, a single quantum well structure, or a multiple quantum well structure. Furthermore, the active area has, for example, an index of refraction of at least n=2.2 and at most n=2.5, in particular n=2.4.

Moreover, the radiation-emitting semiconductor chip has, for example, a main extension plane. Lateral directions are aligned in parallel to the main extension plane and a vertical direction is aligned perpendicularly to the main extension plane.

According to at least one embodiment of the method, a first recess is created in the semiconductor layer sequence, which completely penetrates the active area. At least two opposing lateral surfaces of the first recess each extend, for example, essentially in the vertical direction. Essentially extending in the vertical direction means that the lateral surfaces of the first recess are each inclined by at most ±1% to a normal of the main extension plane, which extends in the vertical direction. The first recess is created, for example, by an etching process. For example, the etching process is a wet chemical etching process or a dry chemical etching process.

A width of the first recess in the lateral directions is, for example, between at least 1 µm and at most 50 µm, in particular between at least 3 µm and at most 10 µm. The width of the first recess corresponds to a minimum distance between the two opposing lateral surfaces of the first recess in the lateral direction.

According to at least one embodiment of the method, a first structure is created in the first recess. For example, a material of the first structure is introduced into the first recess. For example, the material of the first structure completely fills the first recess after the introduction. The material of the first structure is subsequently structured by means of an etching process to form the first structure. For example, the etching process is a wet chemical etching process. For example, KOH and NaOH are used in combination with a mask in the wet chemical etching process.

Alternatively, the material of the first structure is structured by means of a lithography process, for example, a UV lithography process, to form the first structure.

Alternatively, the material of the first structure is introduced into the first recess in such a way that the first structure is created upon the introduction. In this case, the first structure is created, for example, by means of an ELO ("epitaxial lateral overgrowth", abbreviated "ELO") process.

According to at least one embodiment of the method, at least one lateral surface of the first structure facing toward the active area extends obliquely to at least one first lateral surface of the semiconductor layer sequence. One of the lateral surfaces of the first recess is formed, for example, by the first lateral surface of the semiconductor layer sequence. Furthermore, another of the lateral surfaces of the first recess is formed, for example, by a further first lateral surface of the semiconductor layer sequence. The first lateral surface of the semiconductor layer sequence and the further first lateral surface of the semiconductor layer sequence are mutually opposite in this case.

In this embodiment, the first lateral surface of the semiconductor layer sequence faces toward the active area, for example. Furthermore, in this embodiment the further first lateral surface of the semiconductor layer sequence faces away from the active area.

Furthermore, it is possible that the first recess structures the semiconductor layer sequence into two areas, which each include an active area. In this case, it is possible that the first structure in the first recess has at least two lateral surfaces, which each extend obliquely in relation to the first lateral surface of the semiconductor layer sequence and the further first lateral surface. For example, one of the lateral surfaces of the first structure extends obliquely to the first lateral surface of the semiconductor layer sequence and another one of the lateral surfaces of the first structure extends obliquely to the further first lateral surface of the semiconductor layer sequence.

According to at least one embodiment of the method, the first structure is spaced apart from the active area in the lateral direction. For example, the lateral surface of the first structure facing toward the active area is arranged spaced apart from the active area. That is to say, the lateral surface of the first structure facing toward the active area is at least in some areas not in direct contact with the semiconductor layer sequence.

For example, a lateral surface of the first structure facing away from the active area is in direct contact with the semiconductor layer sequence, in particular the active area. In this case, the first structure completely covers the further first lateral surface of the semiconductor layer sequence.

If the first recess structures the semiconductor layer sequence into two areas, which each include an active area, the two lateral surfaces of the first structure are each spaced apart from the opposite active area.

In at least one embodiment, the method for producing a radiation-emitting semiconductor chip comprises providing a semiconductor layer sequence comprising an active area, which is designed to generate electromagnetic radiation. Furthermore, a first recess is created in the semiconductor layer sequence, which completely penetrates the active area. Moreover, a first structure is created in the first recess, wherein at least one lateral surface of the first structure facing toward the active area extends obliquely in relation to at least one first lateral surface of the semiconductor layer sequence, and the first structure is spaced apart from the active area in lateral directions.

According to at least one embodiment of the method, the first structure predetermines a propagation direction for the electromagnetic radiation. The electromagnetic radiation generated in the active area is coupled, for example, through the first lateral surface of the semiconductor layer sequence into the first recess. This coupled-in electromagnetic radiation can subsequently be reflected and deflected on the first structure. The propagation direction of the electromagnetic radiation is then predetermined in dependence on the inclination of the lateral surface of the first structure.

One concept of the method described here for producing a radiation-emitting semiconductor chip is, among other things, that the first structure is created spaced apart in the lateral direction from the active area in the first recess. This first structure predetermines a propagation direction for the electromagnetic radiation. The first structure is, for example, a deflection structure for the electromagnetic radiation. The electromagnetic radiation can in particular be deflected by 45°, so that the radiation-emitting semiconductor chip is designed to emit the electromagnetic radiation in the vertical direction.

Due to the use of the first structure, complex structuring of the semiconductor layer sequence can be omitted. Furthermore, the shape of the first structure and thus the deflection of the electromagnetic radiation can be predetermined particularly well and thus monitored. Furthermore, such a method is particularly cost-effective.

According to at least one embodiment, the lateral surface of the first structure encloses an angle of 45°±1° with the first lateral surface of the semiconductor layer sequence. The electromagnetic radiation generated by the active area can advantageously be emitted through such a first structure in the vertical direction from the radiation-emitting semiconductor chip.

If the first recess structures the semiconductor layer sequence into two areas, which each include an active area, the two lateral surfaces of the first structure each enclose an angle of 45°±1° with the main extension plane of the semiconductor chip. The two lateral surfaces of the first structure enclose, for example, an angle of 90°±2° with one another.

According to at least one embodiment of the method, the semiconductor layer sequence comprises a first semiconductor area and a second semiconductor area. The first semiconductor area and the second semiconductor area are, for example, stacked on one another in the vertical direction. The active area is arranged, for example, between the first semiconductor area and the second semiconductor area.

The first semiconductor area has, for example, a first conductivity type and the second semiconductor area has, for example, a second, different conductivity type. For example, the first semiconductor area is made p-doped and thus p-conductive. Furthermore, the second semiconductor area is made, for example, n-doped and thus n-conductive.

According to at least one embodiment of the method, the first recess exposes the second semiconductor area. In this case, the exposed second semiconductor area forms a bottom surface of the first recess. The first recess penetrates, for example, the first semiconductor area and the active area completely and the second area only partially. The lateral surfaces of the first recess are formed, for example, by the first semiconductor area, the active area, and the second semiconductor area.

According to at least one embodiment of the method, the first structure is created on the exposed second semiconductor area. For example, the first structure is created on the bottom surface of the first recess. The first structure, in particular a base surface of the first structure, is, for example, in direct contact with the exposed second semiconductor area.

According to at least one embodiment of the method, the semiconductor layer sequence is arranged on a substrate. For example, the substrate is the growth substrate of the semiconductor layer sequence.

According to at least one embodiment of the method, the first recess penetrates the semiconductor layer sequence completely.

In this case, the first recess penetrates the first semiconductor area, the active area, and the second semiconductor area completely. The exposed substrate forms, for example, the bottom surface of the first recess.

According to at least one embodiment of the method, the first structure is created on the exposed substrate. In this case, the first structure is created on the bottom surface of the first recess. The first structure, in particular the base surface of the first structure, is, for example, in direct contact with the exposed substrate.

According to at least one embodiment, the first structure comprises a dielectric material. In this case, the first recess is completely filled, for example, using the dielectric material. The dielectric material is subsequently structured, for example, by means of the etching process to form the first structure.

The dielectric material of the first structure comprises or consists, for example, of SiO having an index of refraction of n=1.5, SiON having an index of refraction of n=1.7, and/or AlO having an index of refraction of n=1.77.

According to at least one embodiment of the method, an index of refraction of the first structure is less than an index of refraction of the semiconductor layer sequence. In particular, the index of refraction of the first structure is less than the index of refraction of the active area. For example, the index of refraction of the first structure is less by at least n=0.7 than the index of refraction of the semiconductor layer sequence, in particular by at least n=0.8.

Due to such an index of refraction difference between the first structure and the semiconductor layer sequence, electromagnetic radiation which is emitted by the active area in the direction of the oblique lateral surface of the first structure is advantageously totally reflected. For example, a critical angle $\theta_c$ results, from which the electromagnetic radiation is totally reflected, by way of $\theta_c = \arcsin(n_2/n_1)$. In this case, $n_1$ is the index of refraction of the semiconductor layer sequence, in particular the active area, and $n_2$ is the index of refraction of the first structure. The electromagnetic radiation generated in the active area is advantageously reflected and deflected by at least 99% due to such an index of refraction difference.

According to at least one embodiment of the method, a dielectric layer is applied to the lateral surface of the first structure. The dielectric layer is, for example, in direct contact with the lateral surface of the first structure.

If the first structure has the two lateral surfaces, which are each arranged spaced apart from the opposite active area, the dielectric layer is arranged on the two lateral surfaces.

Furthermore, the dielectric layer is spaced apart from the active area, for example, in lateral directions. The dielectric layer has, for example, a thickness of at least 50 nm, in particular at least 100 nm.

According to this embodiment, the electromagnetic radiation is totally reflected due to an index of refraction difference between the dielectric layer and the semiconductor layer sequence. In this case, in the above-mentioned relationship with respect to the critical angle $\theta_c$, $n_2$ is the index of refraction of the dielectric layer.

According to at least one embodiment of the method, an index of refraction of the dielectric layer is less than an index of refraction of the semiconductor layer sequence. In particular, the index of refraction of the dielectric layer is less than the index of refraction of the active area.

The dielectric layer comprises or consists, for example, of a dielectric material, for example, SiO, SiON, and/or AlO.

According to at least one embodiment of the method, a filler material is applied between the first structure and the semiconductor layer sequence. For example, the filler material is arranged between the first structure and the active area. In particular, the first recess is completely filled using the filler material.

The filler material is, for example, one or more of the following materials: TaO, TiO, NiO, NbO, AlN, GaN, InGaN. The filler material has, for example, an index of refraction of at least n=2.2 and at most n=2.5.

According to at least one embodiment of the method, an index of refraction of the filler material deviates by not more than n=0.2 from an index of refraction of the semiconductor layer sequence. In particular, the index of refraction of the filler material deviates by not more than n=0.2 from the index of refraction of the active area.

For example, the index of refraction of the filler material can be adapted, by suitable specification of deposition parameters of the filler material, particularly well to the index of refraction of the semiconductor layer sequence, in particular the active area. The deposition parameters are, for example, a growth temperature, a growth speed, and/or a reactor pressure.

For example, the index of refraction of the filler material can deviate by not more than n=0.1 from the index of refraction of the semiconductor layer sequence.

According to this embodiment, in the above-mentioned relationship with respect to the critical angle $\theta_c$, $n_1$ is the index of refraction of the filler material.

According to at least one embodiment of the method, a first dielectric mirror is applied over the first structure. For example, the first dielectric mirror completely covers the first structure in a top view. Furthermore, the first dielectric mirror is arranged, for example, on the filler material. The filler material and the first dielectric mirror are, for example, in direct contact with one another. The first dielectric mirror is, for example, a Bragg mirror.

According to at least one embodiment of the method, the first dielectric mirror extends along the main extension plane. The electromagnetic radiation generated by the active area is decoupled, for example, via the first dielectric mirror from the radiation-emitting semiconductor chip. A propagation direction of the electromagnetic radiation is in the vertical direction in this case.

According to at least one embodiment, the first dielectric mirror is made partially reflective for the electromagnetic radiation. The first dielectric mirror has, for example, a reflectivity of at most 90%, in particular of at most 10%, for the electromagnetic radiation generated in the active area.

According to at least one embodiment of the method, a passivation layer is applied to the first lateral surface of the semiconductor layer sequence. For example, the passivation layer completely covers the active area. The passivation layer is applied, for example, before the application of the filler material to the first lateral surface of the semiconductor layer sequence.

For example, an index of refraction of the passivation layer deviates by not more than n=0.2 from the index of refraction of the semiconductor layer sequence, in particular of the active area. The passivation layer includes, for example, one or more of the following materials: TaO, TiO, NiO, NbO, AlN.

The semiconductor layer sequence is advantageously protected particularly well by such a passivation layer from external effects, which act on the semiconductor layer sequence during the method.

According to at least one embodiment of the method, the first structure has the shape of a triangle or trapezoid in cross section in the vertical direction. If the first structure has the shape of a triangle, the triangle is, for example, an isosceles triangle. In this case, the two lateral surfaces of the first structure enclose a right angle.

If the first structure has the shape of a trapezoid, the trapezoid comprises at least two lateral surfaces, which each enclose an angle of 45°±1 with a base surface of the trapezoid. Furthermore, the first structure extends in lateral directions perpendicular to the cross section in the vertical direction. The first structure is a prism in this case.

According to at least one embodiment of the method, a second recess is created in the semiconductor layer sequence, which completely penetrates the active area. The second recess is created identically to the first recess, for example.

Furthermore, the second recess has, for example, the same dimensions and/or the same shape as the first recess. In particular, all features disclosed in conjunction with the first recess can be applied similarly to the second recess.

According to at least one embodiment of the method, a second structure is created in the second recess. The second structure is created, for example, identically to the first structure.

Furthermore, the second structure includes the same materials as the first structure. The second structure moreover has, for example, the same dimensions as the first structure. In particular, all features disclosed in conjunction with the first structure can be applied similarly to the second structure.

According to at least one embodiment of the method, at least one lateral surface of the second structure facing toward the active area extends obliquely to at least one second lateral surface of the semiconductor layer sequence.

According to at least one embodiment of the method, the second structure is spaced apart from the active area in the lateral direction.

According to at least one embodiment, the active area is arranged between the first recess and the second recess. An extension of the active area in lateral directions is defined, for example, by the first recess and the second recess. For example, the active area extends from the first lateral surface of the semiconductor layer sequence to the second lateral surface of the semiconductor layer sequence.

According to at least one embodiment of the method, a second dielectric mirror is applied over the second structure. For example, the second dielectric mirror completely covers the second structure in a top view. The second dielectric mirror is, for example, a Bragg mirror.

For example, the filler material is arranged completely in the second recess. The second dielectric mirror is, for example, arranged on the filler material in the second recess. The filler material and the second dielectric mirror are in direct contact with one another, for example.

According to at least one embodiment of the method, the second dielectric mirror extends along the main extension plane.

According to at least one embodiment of the method, the second dielectric mirror is made highly reflective for the electromagnetic radiation. The second dielectric mirror has, for example, a reflectivity of at least 95%, in particular at least 99%, for the electromagnetic radiation generated in the active area.

The radiation-emitting semiconductor chip comprises, for example, a resonator, which is formed between the first dielectric mirror and the second dielectric mirror. The resonator is defined, for example, by the area between the first dielectric mirror and the second dielectric mirror. Moreover, the resonator comprises the active area.

In dependence on the reflectivity of the first dielectric mirror, the radiation-emitting semiconductor chip is, for example, a surface-emitting laser diode or a surface-emitting superluminescent diode, abbreviated SLED. If the radiation-emitting semiconductor chip is a SLED, the generated radiation is amplified to form superluminescent radiation in the resonator. If the semiconductor chip is a laser diode, the generated radiation is amplified to form laser radiation in the resonator.

According to at least one embodiment of the method, the semiconductor layer sequence is isolated to form the semiconductor chip by means of a cut in the vertical direction. For example, the semiconductor layer sequence is isolated by means of the cut through the first structure and the second structure. In particular, the semiconductor layer sequence is isolated by means of the cut through the first structure, the second structure, and the semiconductor layer sequence. Alternatively, the semiconductor layer sequence is isolated by means of the cut through the semiconductor layer sequence.

For example, it is possible that a plurality of first recesses each having a first structure and a plurality of second recesses each having a second structure are created in the semiconductor layer sequence. The first recesses and the second recesses are arranged alternating in this case. It is possible to produce a plurality of radiation-emitting semiconductor chips by the isolation, in particular by cuts through the first structures and the second structures.

In addition, a radiation-emitting semiconductor chip is specified. The radiation-emitting semiconductor chip can in particular be produced using the method described here for producing a radiation-emitting semiconductor chip. That is to say, a radiation-emitting semiconductor chip described here is producible using the described method or is produced using the described method. All features disclosed in conjunction with the method are therefore also disclosed in conjunction with the radiation-emitting semiconductor chip and vice versa.

According to at least one embodiment, the radiation-emitting semiconductor chip comprises a semiconductor layer sequence comprising an active area, which is designed to generate electromagnetic radiation.

According to at least one embodiment, the radiation-emitting semiconductor chip comprises a first recess in the semiconductor layer sequence, which completely penetrates the active area.

According to at least one embodiment, the radiation-emitting semiconductor chip comprises a first structure, which is arranged in the first recess.

According to at least one embodiment of the radiation-emitting semiconductor chip, at least one lateral surface of the first structure facing toward the active area extends obliquely in relation to at least one first lateral surface of the semiconductor layer sequence.

According to at least one embodiment of the radiation-emitting semiconductor chip, the first structure is spaced apart in the lateral direction from the active area.

According to at least one embodiment, the radiation-emitting semiconductor chip comprises a second recess in the semiconductor layer sequence, which completely penetrates the active area.

According to at least one embodiment, the radiation-emitting semiconductor chip comprises a second structure in the second recess.

According to at least one embodiment of the radiation-emitting semiconductor chip, a lateral surface of the second structure facing toward the active area extends obliquely in relation to a second lateral surface of the semiconductor layer sequence.

According to at least one embodiment of the radiation-emitting semiconductor chip, the second structure is spaced apart from the active area in lateral directions.

According to at least one embodiment of the radiation-emitting semiconductor chip, the active area is arranged between the first recess and the second recess.

According to at least one embodiment of the radiation-emitting semiconductor chip, the semiconductor chip is a surface-emitting laser diode. In this case, the decoupled electromagnetic radiation is monochromatic and coherent radiation. The radiation thus advantageously has a comparatively low bandwidth, with comparatively high luminous flux at the same time.

According to at least one embodiment of the radiation-emitting semiconductor chip, the semiconductor chip is a surface-emitting superluminescent diode. In this embodiment, the electromagnetic radiation generated by the active area is advantageously amplified, wherein the decoupled electromagnetic radiation has a comparatively small time coherence and a comparatively large spatial coherence.

The radiation-emitting semiconductor chip is explained in more detail hereinafter with reference to the figures on the basis of exemplary embodiments.

BRIEF DESCRIPTION OF THE DRAWINGS

In the Figures:

FIGS. 21, 22, and 23 show schematic sectional illustrations of a radiation-emitting semiconductor chip according to one exemplary embodiment in each case.

DETAILED DESCRIPTION

Identical, equivalent, or identically acting elements are provided with identical reference signs in the figures. The figures and the size relationships of the elements shown in the figures to one another are not to scale. Rather, individual elements can be shown exaggeratedly large for better representability and/or for better comprehension.

Figure 1:
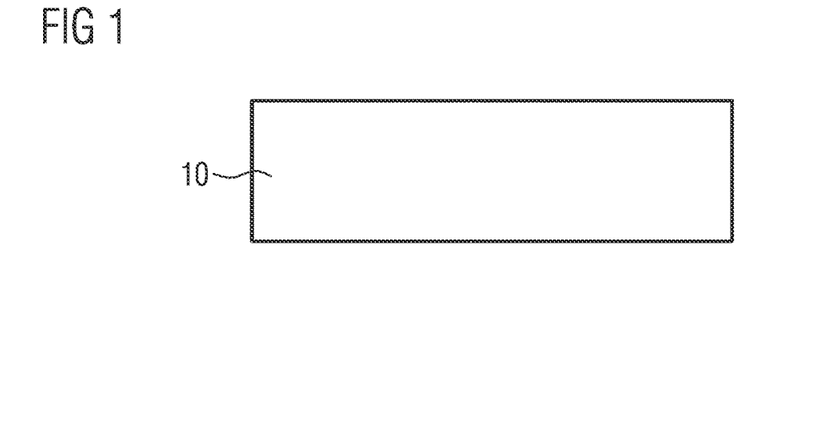
FIGS. 1, 2, 3, 4, 5, 6, 7, and 8 show schematic sectional illustrations of method steps in the production of a semiconductor chip according to one exemplary embodiment.

In the method according to the exemplary embodiment of FIGS. 1 to 8, a substrate 10 is provided according to FIG. 1. The substrate 10 is, for example, a GaN substrate.

Figure 2:
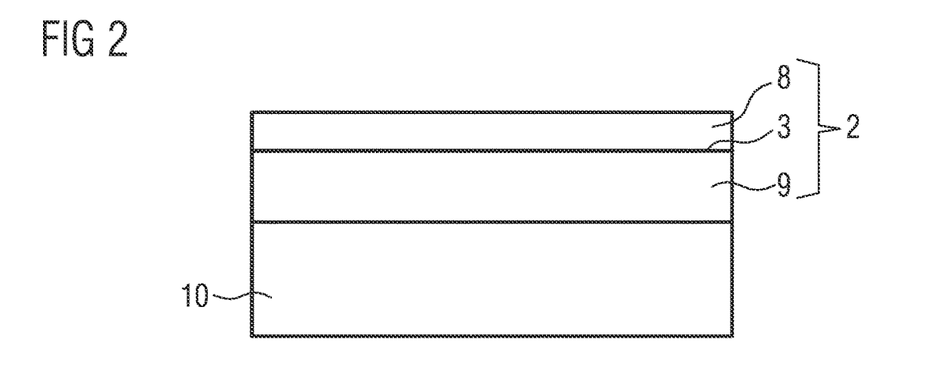

In a further method step according to FIG. 2, a semiconductor layer sequence 2 is epitaxially deposited on the substrate 10. The semiconductor layer sequence 2 comprises a first semiconductor area 8, an active area 3, and a second semiconductor area 9. The active area 3 is designed to generate electromagnetic radiation.

Figure 3:
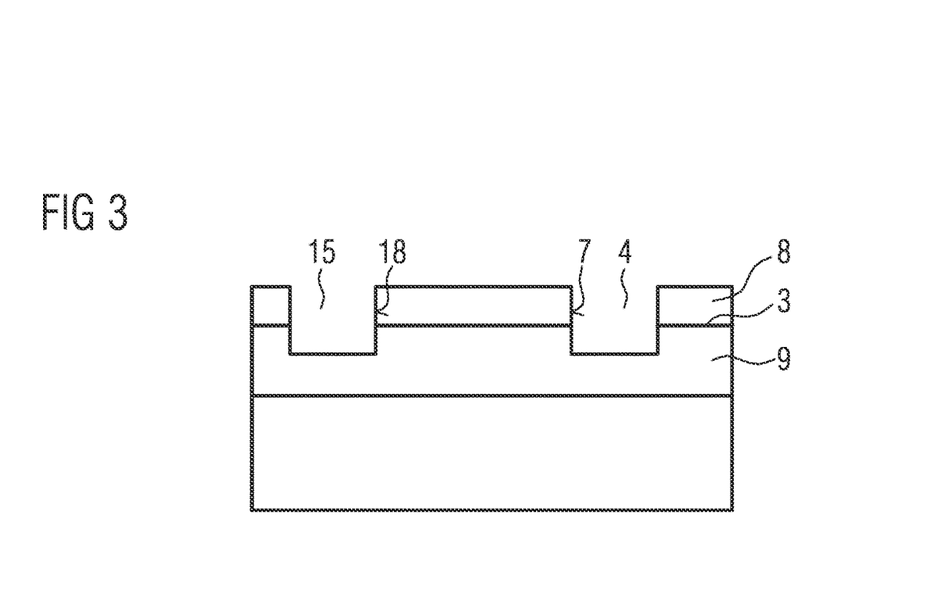

According to FIG. 3, in a next method step a first recess 4 and a second recess 15 are created in the semiconductor layer sequence 2, which each completely penetrate the second semiconductor area 9 and the active area 3. The first recess 4 and the second recess 15 each expose the second semiconductor area 9, so that the second semiconductor area 9 is freely accessible in each case in the first recess 4 and in the second recess 15.

Two mutually opposite lateral surfaces of the first recess 4 and two mutually opposite lateral surfaces of the second recess 15 each extend essentially in the vertical direction.

The active area 3 is arranged between the first recess 4 and the second recess 15. A first lateral surface of the semiconductor layer sequence 7 is formed by one of the lateral surfaces of the first recess 4, which faces toward the active area 3. A second lateral surface of the semiconductor layer sequence 18 is formed by one of the lateral surfaces of the second recess 15, which faces toward the active area 3. The active area 3 extends from the first lateral surface of the semiconductor layer sequence 7 to the second lateral surface of the semiconductor layer sequence 18.

The active area 3 comprises, for example, InGaN having an index of refraction of $n_{HL}=2.4$.

Figure 4:
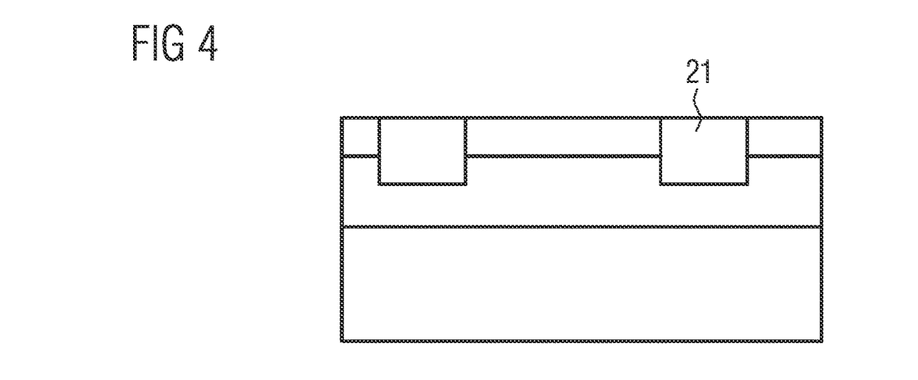

In a further method step, as shown in FIG. 4, a dielectric material 21 is introduced in each case into the first recess 4 and the second recess 15. In this exemplary embodiment, the first recess 4 and the second recess 15 are each completely filled using the dielectric material 21.

The dielectric material 21 comprises, for example, SiO having an index of refraction of $n_{s1}=n_{s2}=1.5$ or SiON having an index of refraction of $n_{s1}=n_{s2}=1.7$.

Figure 5:
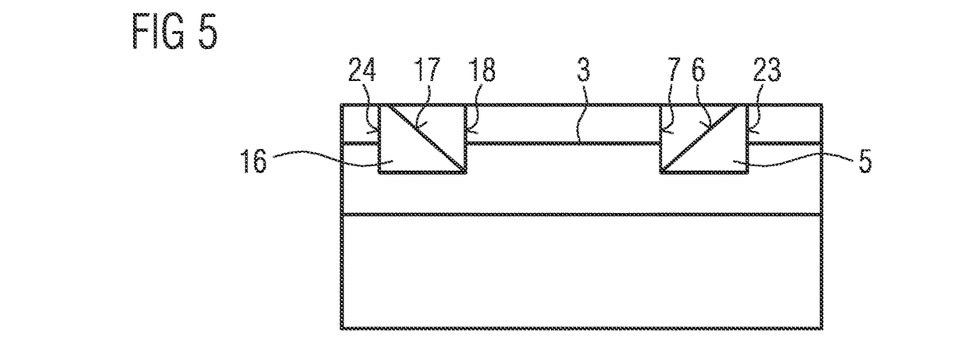

The dielectric material 21 is then structured in a next method step, as schematically shown in FIG. 5, by means of an etching process to form the first structure 5 and the second structure 16.

A lateral surface of the first structure 6 facing toward the active area 3 extends obliquely to the first lateral surface of the semiconductor layer sequence 7. Furthermore, a lateral surface of the second structure 17 facing toward the active area 3 extends obliquely to the second lateral surface of the semiconductor layer sequence 18.

Moreover, the first structure 5 completely covers a further first lateral surface of the semiconductor layer sequence 23 facing away from the active area 3. Furthermore, the second structure 16 completely covers a further second lateral surface of the semiconductor layer sequence 24 facing away from the active area 3.

The first structure 5 has a shape of a triangle in cross section in the vertical direction. The triangle is an isosceles triangle. A right angle of the isosceles triangle is in the area of an edge between a bottom surface of the first recess 4 and the further first lateral surface of the semiconductor layer sequence 23 facing away from the active area 3.

Moreover, the second structure 16 has the shape of an isosceles triangle in cross section in the vertical direction. A right angle of the isosceles triangle is in the area of an edge between a bottom surface of the second recess 15 and a further second lateral surface of the semiconductor layer sequence 24 facing away from the active area 3.

The lateral surface of the first structure 6 facing toward the active area 3 encloses an angle of $45°\pm1°$ with the first lateral surface of the semiconductor layer sequence 7. Furthermore, the lateral surface of the second structure 17 facing toward the active area 3 encloses an angle of $45°\pm1°$ with the second lateral surface of the semiconductor layer sequence 18.

Figure 6:
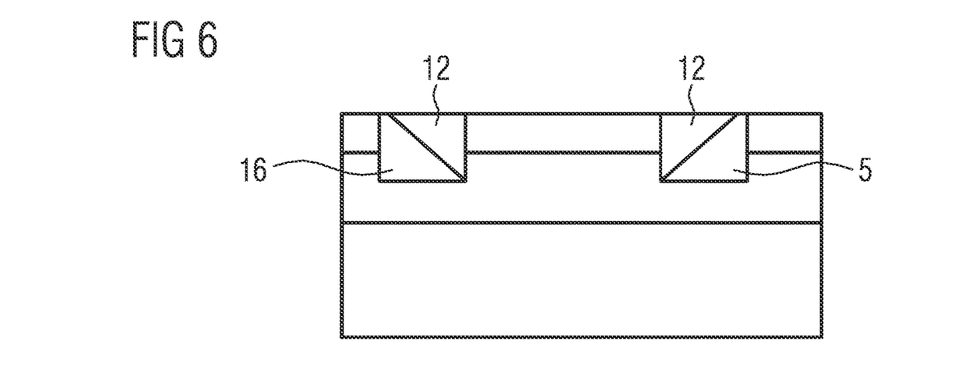

In a further method step, as shown in FIG. 6, a filler material 12 is applied between the first structure 5 and the semiconductor layer sequence 2. The filler material 12 completely fills the first recess 4. Furthermore, the filler material 12 is applied between the second structure 16 and the semiconductor layer sequence 2. The filler material 12 completely fills the second recess 15.

The filler material 12 comprises, for example, NiO having an index of refraction of $n_F=2.3$ or AlN having an index of refraction of $n_F=2.2$.

Figure 7:
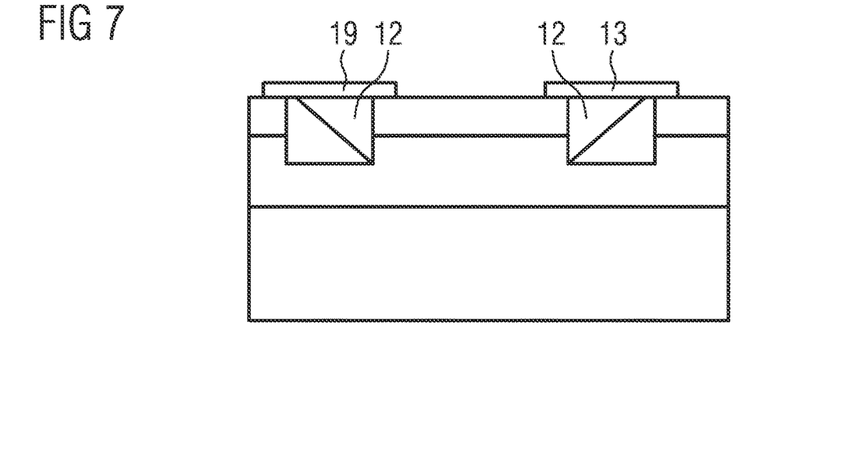

Moreover, in a further method step, shown in FIG. 7, a first dielectric mirror 13 is applied over the first structure 5 and the filler material 12. Furthermore, in this method step a second dielectric mirror 19 is applied over the second structure 16 and the filler material 12.

The first dielectric mirror 13 is made partially reflective for the electromagnetic radiation. The second dielectric mirror 19, in contrast to the first dielectric mirror 13, is made highly reflective for the electromagnetic radiation.

Figure 8:
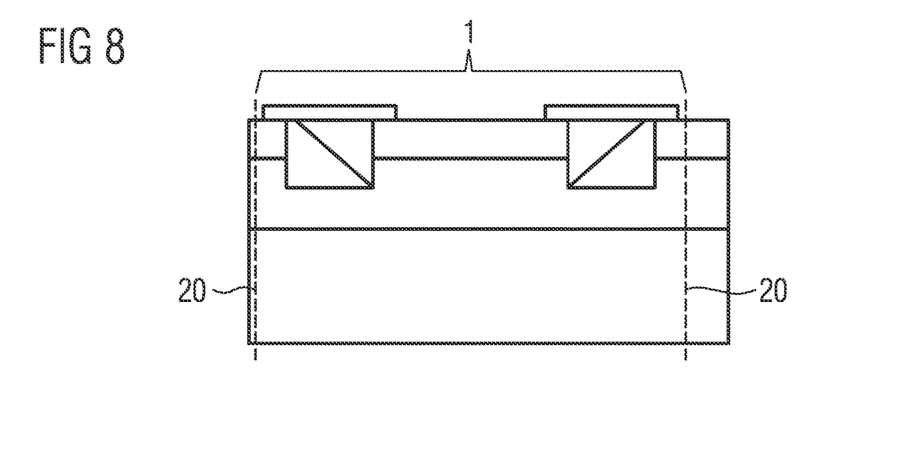

As schematically shown in FIG. 8, the semiconductor layer sequence 2 is isolated in a further method step by means of a cut 20 in the vertical direction to form the radiation-emitting semiconductor chip 1.

Figure 9:
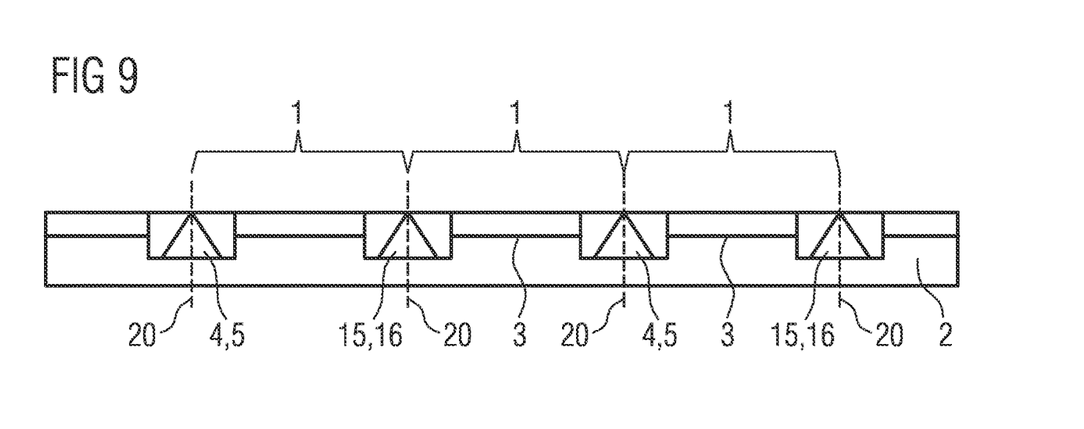
FIG. 9 shows a schematic sectional illustration of a method step in the production of a semiconductor chip according to one exemplary embodiment.

In contrast to the exemplary embodiment of FIGS. 1 to 8, in the semiconductor layer sequence 2 according to the exemplary embodiment of FIG. 9, a plurality of first recesses 4 each having a first structure 5 and a plurality of second recesses 15 each having a second structure 16 are created. The first recesses 4 and the second recesses 15 are arranged alternating.

In this exemplary embodiment, one of the first recesses 4 structures the semiconductor layer sequence 2 into two areas, which each have an active area 3.

Furthermore, the first structures 5 and the second structures 16 each have the shape of an isosceles triangle in cross section in the vertical direction. The right angles of the triangles of the first structures 5 are in this case each located in a central area between two mutually opposite lateral surfaces of the semiconductor layer sequence 2, thus the first lateral surface of the semiconductor layer sequence 7 and the further first lateral surface of the semiconductor layer sequence 23.

Furthermore, the right angles of the triangles of the second structures 16 are each located in a central area between two mutually opposite lateral surfaces of the semiconductor layer sequence 2, thus the second lateral surface of the semiconductor layer sequence 18 and the further first lateral surface of the semiconductor layer sequence 24.

Due to such a shape, the first structures 5 each have two lateral surfaces, which extend obliquely to the first lateral surface of the semiconductor layer sequence 7 and the further first lateral surface of the semiconductor layer sequence 23. Furthermore, the two structures 16 each have two lateral surfaces, which extend obliquely to the second lateral surface of the semiconductor layer sequence 18 and the further first lateral surface of the semiconductor layer sequence 24.

In this exemplary embodiment, the semiconductor layer sequence 2 is isolated by means of cuts 20 in the vertical direction through the first structures 5 and the second structures 16 into a plurality of radiation-emitting semiconductor chips 1.

Figure 10:
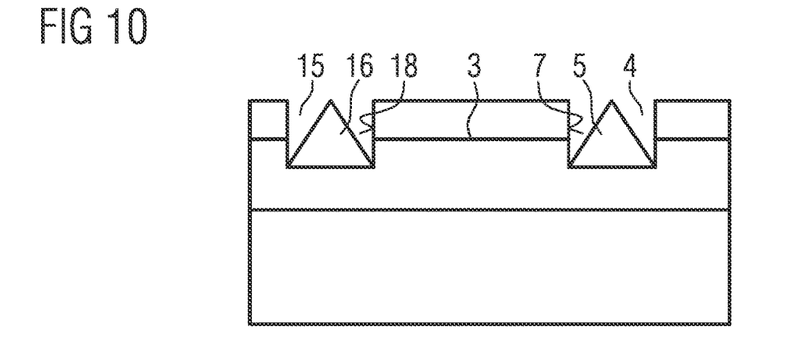
FIGS. 10, 11, 12, and 13 show schematic sectional illustrations of method steps in the production of a semiconductor body according to one exemplary embodiment.

In the method according to the exemplary embodiment of FIGS. 10 to 13, the material of the first structure 5 and the material of the second structure 16, as shown in FIG. 10, are introduced into the first recess 4 in such a way that the first structure 5 and the second structure 16 are created upon the introduction.

The first structure 5 and the second structure 16 are created simultaneously.

The material of the first structure 5 is identical to the material of the second structure 16 and comprises, for example, InGaN. The first structure 5 and the second structure 16 are generated by means of an ELO ("epitaxial lateral overgrowth", abbreviated "ELO") process.

The first structure 5 has two lateral surfaces in this exemplary embodiment. One of the lateral surfaces of the first structure 6 encloses an angle of 45°±1° with a first lateral surface of the semiconductor layer sequence 7. Furthermore, another of the lateral surfaces of the first structure 6 encloses an angle of 45°±1° with a further first lateral surface of the semiconductor layer sequence 23. Furthermore, the second structure 16 has at least two lateral surfaces. One of the lateral surfaces of the second structure 17 encloses an angle of 45°±1° with a second lateral surface of the semiconductor layer sequence 18. Furthermore, another of the lateral surfaces of the second structure 17 encloses an angle of 45°±1° with a further second lateral surface of the semiconductor layer sequence 24.

Figure 11:
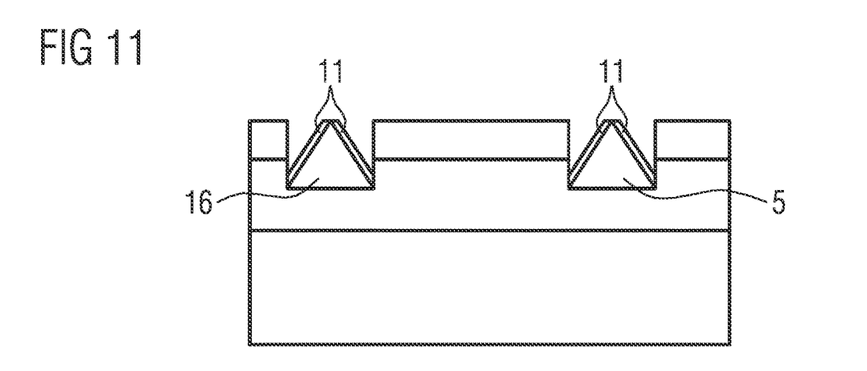

According to FIG. 11, a dielectric layer 11 is applied to the lateral surfaces of the first structure 5 and to the lateral surfaces of the second structure 16. The dielectric layer 11 follows the course of the inclinations of the lateral surfaces of the first structure 5 and the course of the inclinations of the lateral surfaces of the second structure 16.

The dielectric layer 11 comprises, for example, SiON having an index of refraction of $n_s=1.7$ or AlO having an index of refraction of $n_s=1.77$.

Figure 12:
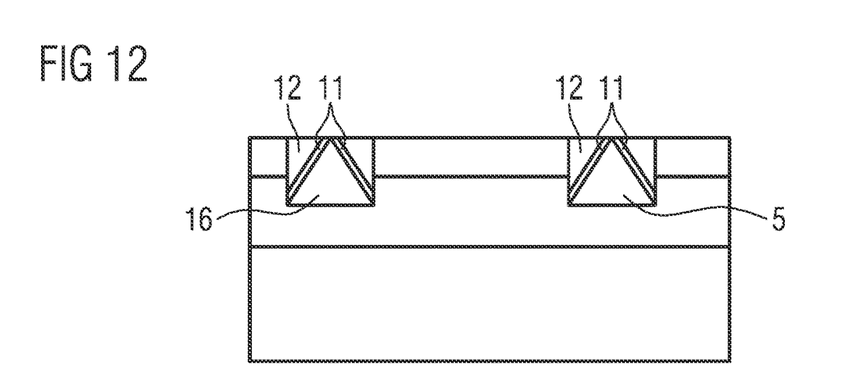
Figure 13:
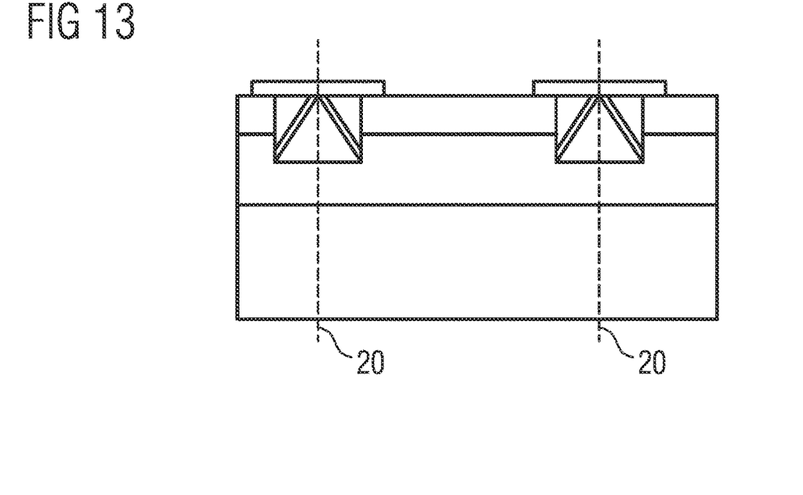

In further method steps according to FIGS. 12 and 13, the first recess 4 and the second recess 15 are each completely filled using a filler material 12. A first dielectric mirror 13 is applied to the filler material 12 over the first structure 5. Furthermore, a second dielectric mirror 19 is applied to the filler material 12 over the second structure 16.

The semiconductor layer sequence 2 is then isolated by means of a cut 20 in the vertical direction through the first structure 5, the first dielectric mirror 13, the filler material 12, the dielectric layer, the first semiconductor area 8, and the substrate 10 and through the second structure 16, the second dielectric mirror 19, the filler material 12, the dielectric layer, the first semiconductor area 8, and the substrate 10 to form the radiation-emitting semiconductor chip 1.

Figure 14:
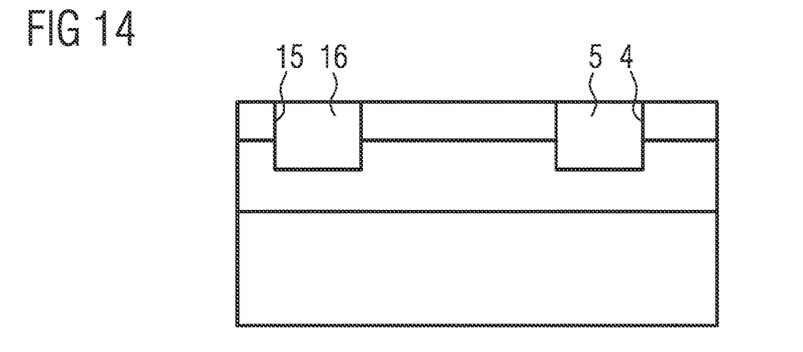
FIGS. 14, 15, 16, 17, and 18 show schematic sectional illustrations of method steps in the production of a semiconductor body according to one exemplary embodiment.

In the method according to the exemplary embodiment of FIGS. 14 to 18, a material of the first structure 5 and the material of the second structure 16, as shown in FIG. 14, is introduced completely into the first recess 4 and into the second recess 15. The material comprises, in contrast to the method step of FIG. 4, for example, Si.

Figure 15:
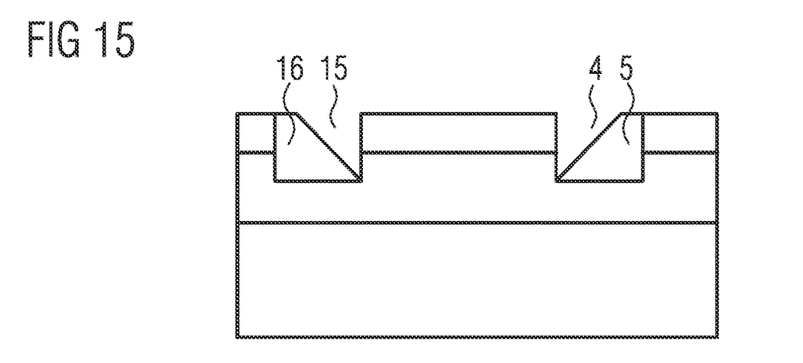
Figure 16:
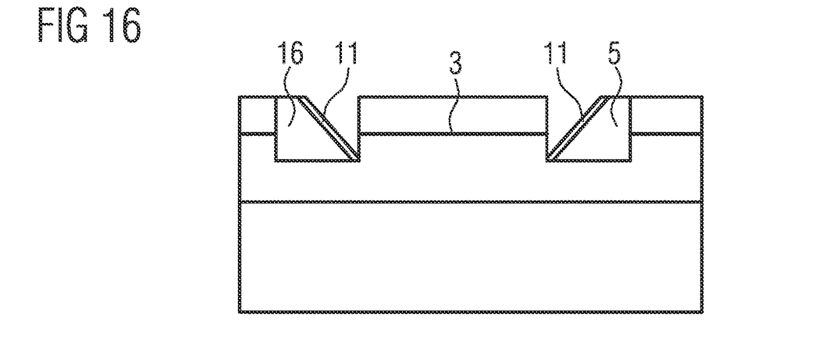
Figure 17:
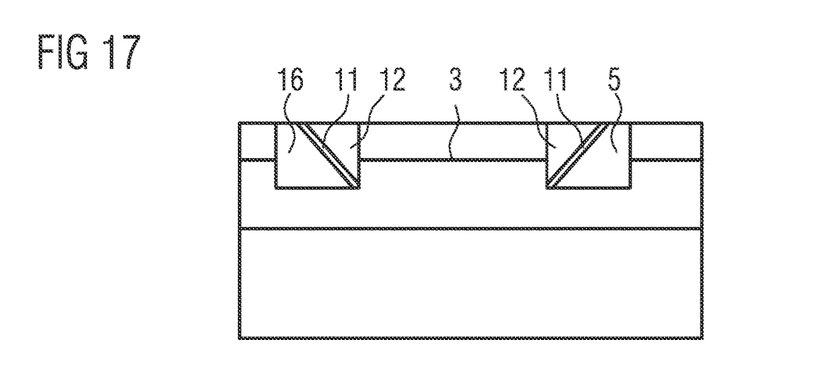
Figure 18:
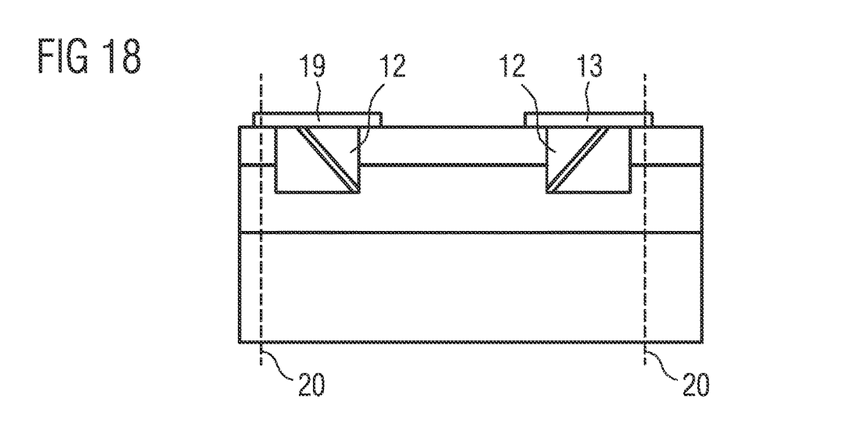

The material is then structured according to FIG. 15 by means of a wet chemical etching process to form the first structure 5 and the second structure 16. A dielectric layer 11 is applied to a lateral surface of the first structure 5 facing toward the active area 3 and to a lateral surface of the second structure 16 facing toward the active area 3, as shown in FIG. 16.

The first recess 4 and the second recess 15 are then each completely filled using a filler material 12. A first dielectric mirror 13 is applied to the filler material 12 over the first structure 5. Furthermore, a second dielectric mirror 19 is applied to the filler material 12 over the second structure 16, as shown in conjunction with FIGS. 17 and 18.

Figure 19:
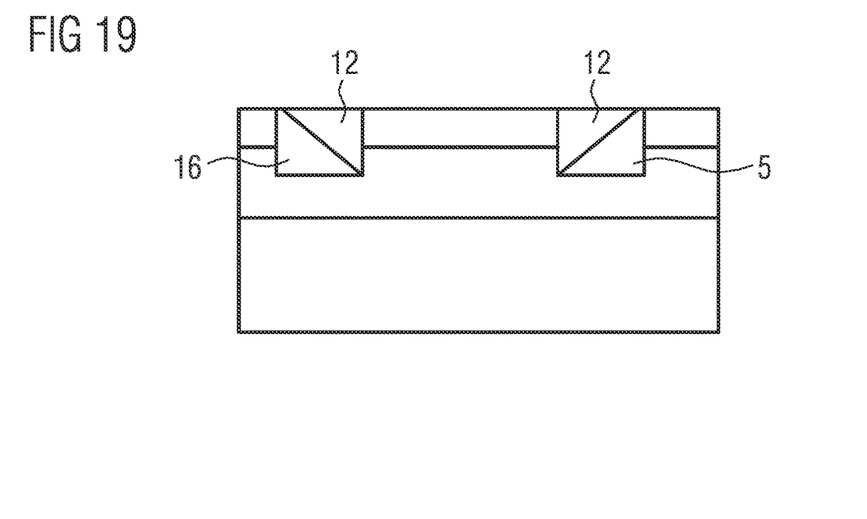
FIGS. 19 and 20 show schematic sectional illustrations of method steps in the production of a semiconductor body according to one exemplary embodiment.
Figure 20:
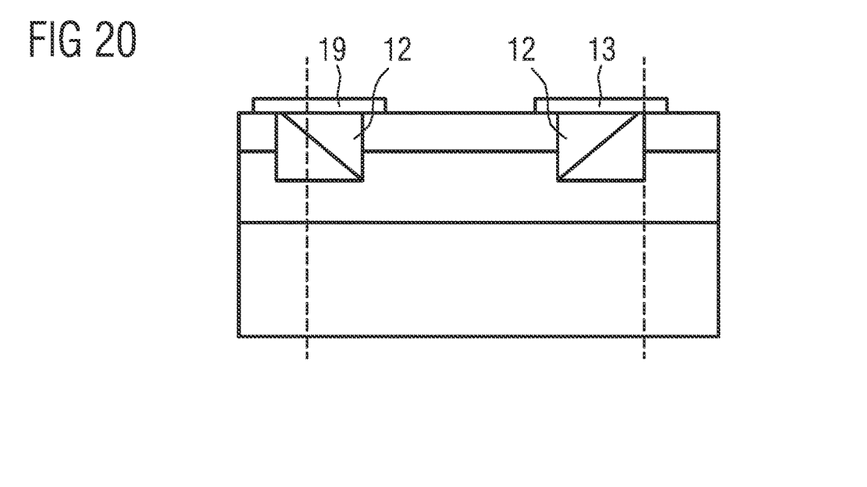

In the method according to the exemplary embodiment of FIGS. 19 and 20, the filler material 12 comprises, in contrast to FIG. 6, for example, GaN and/or InGaN. The filler material 12 is, for example, introduced epitaxially into the first recess 4 and the second recess 15. Alternatively, the filler material 12 is introduced by sputtering into the first recess 4 and the second recess 15.

Figure 21:
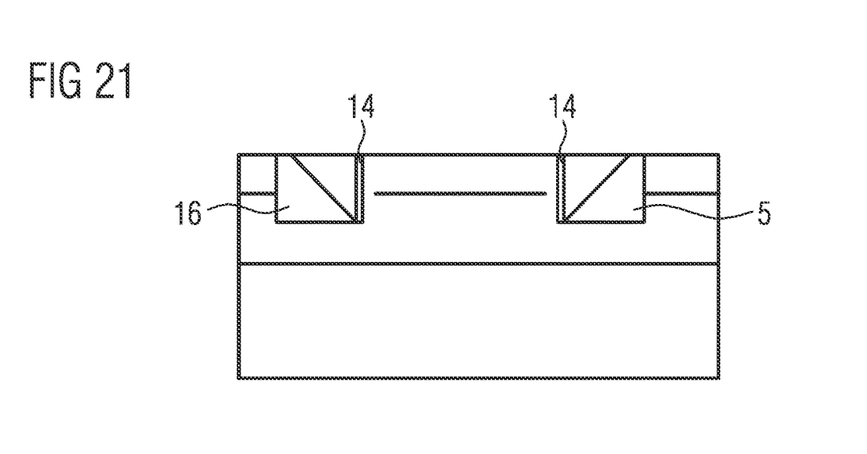
FIG. 21 shows a schematic sectional illustration of a method step in the production of a semiconductor chip according to one exemplary embodiment.

In the method step according to the exemplary embodiment of FIG. 21, before the application of the filler material 12 to a first lateral surface of the semiconductor layer sequence 7 and a second lateral surface of the semiconductor layer sequence 18, a passivation layer 14 is applied. The passivation layer 14 completely covers the first lateral surface of the semiconductor layer sequence 7 and the second lateral surface of the semiconductor layer sequence 18.

The passivation layer 14 comprises, for example, AlN having an index of refraction of n=2.2.

Figure 22:
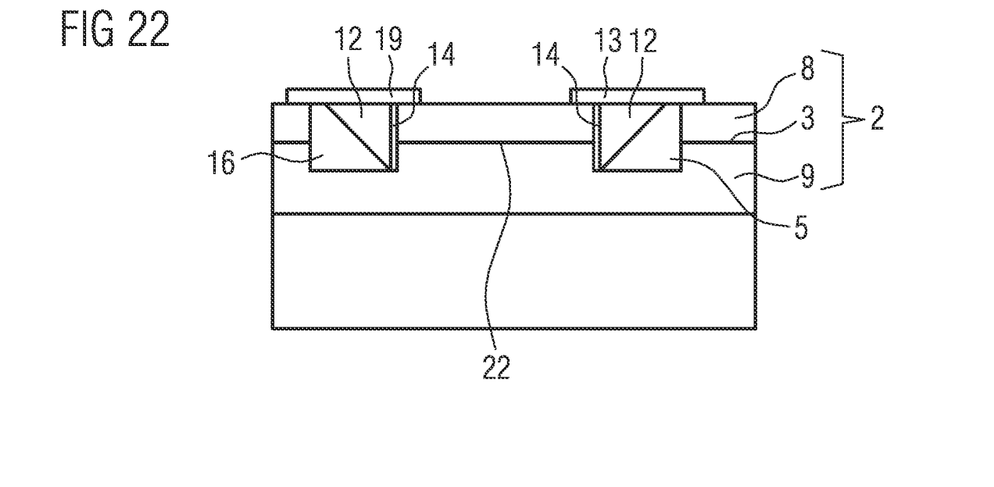

The radiation-emitting semiconductor chip 1 according to the exemplary embodiment of FIG. 22 comprises a semiconductor layer sequence 2. The semiconductor layer sequence 2 comprises a first semiconductor area 8, a second semiconductor area 9, and an active area 3 arranged in between. The active area 3 is designed to generate electromagnetic radiation.

Furthermore, the semiconductor chip 1 comprises a first recess 4 and a second recess 15 in the semiconductor layer sequence 2, which each completely penetrate the active area 3. A first structure 5 is arranged in the first recess 4 and a second structure 16 is arranged in the second recess 15.

A lateral surface of the first structure 6 facing toward the active area 3 extends obliquely to a first lateral surface of the semiconductor layer sequence 7. Furthermore, a lateral surface of the second structure 17 facing toward the active area 3 extends obliquely to a second lateral surface of the semiconductor layer sequence 18. The first structure 5 and the second structure 16 are each spaced apart in lateral directions from the active area 3.

Furthermore, the active area 3 is arranged between the first lateral surface of the semiconductor layer sequence 7 and the second lateral surface of the semiconductor layer sequence 18. Furthermore, a passivation layer 14 is arranged in each case on the first lateral surface of the semiconductor layer sequence 7 and the second lateral surface of the semiconductor layer sequence 18.

A filler material 12 is arranged in each case on the first structure 5 and the second structure 16, which completely fills the first recess 4 and the second recess 15. A first dielectric mirror 13 is arranged on the filler material 12 over the first structure 5 and a second dielectric mirror 19 is arranged on the filler material 12 over the second structure 16.

Figure 23:
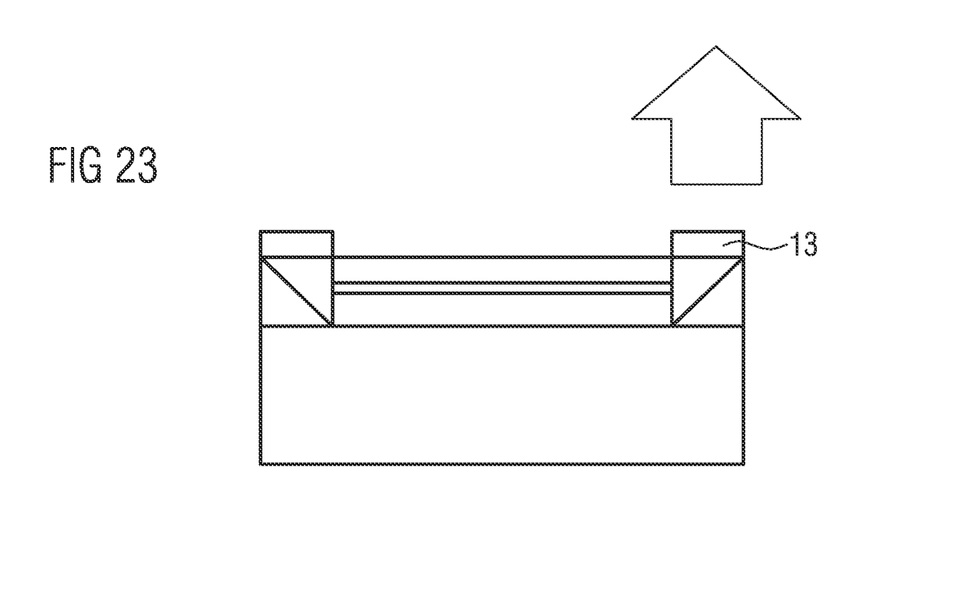

According to the exemplary embodiment of FIG. 23, the electromagnetic radiation generated by the active area 3 can be decoupled via the first dielectric mirror 13 from the radiation-emitting semiconductor chip 1. A propagation direction of the electromagnetic radiation, which is shown in FIG. 23 as the arrow, extends in the vertical direction.

Figure 24:
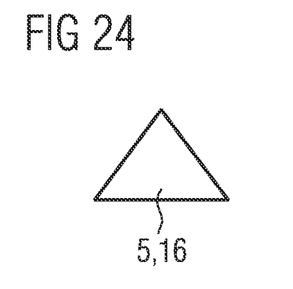
FIGS. 24 and 25 show schematic sectional illustrations of first structures.
Figure 25:
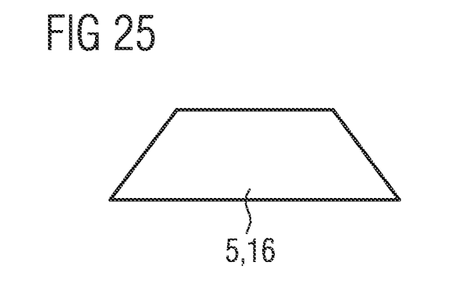

The first structure 5 according to FIG. 24 has a shape of an isosceles triangle, as described in conjunction with FIG. 10, for example.

The first structure 5 according to FIG. 24 has a shape of a trapezoid. In this case, the trapezoid comprises at least two lateral surfaces, which each enclose an angle of 45°±1 with a base surface of the trapezoid. The second structure 16 can also have such a shape.

The radiation-emitting semiconductor chip 1 comprises, for example, a resonator 22, which is formed between the first dielectric mirror 11 and the second dielectric mirror 12. The resonator 22 furthermore comprises the active area 3.

The priority of German patent application DE 102020122210.6 is claimed, the disclosure of which is hereby expressly incorporated by reference.

The features and exemplary embodiments described in conjunction with the figures can be combined with one another according to further exemplary embodiments, even if all combinations are not explicitly described. Furthermore, the exemplary embodiments described in conjunction with the figures can alternatively or additionally have further features according to the description in the general part.

The invention is not restricted to the exemplary embodiments by the description on the basis thereof. Rather, the invention comprises every novel feature and every combination of features, which includes in particular every combination of features in the claims, even if this feature or this combination is not explicitly specified in the claims or exemplary embodiments.

The invention claimed is:

1. A method for producing a radiation-emitting semiconductor chip comprising:
   providing a semiconductor layer sequence comprising an active area, which is designed to generate electromagnetic radiation,
   creating a first recess in the semiconductor layer sequence, which completely penetrates the active area,
   creating a first structure in the first recess, and
   applying a first dielectric mirror over the first structure, wherein
   at least one lateral surface of the first structure facing toward the active area extends obliquely to at least one first lateral surface of the semiconductor layer sequence,
   the first structure is spaced apart in lateral directions from the active area,
   the first dielectric mirror extends along a main extension plane of the semiconductor chip,
   the first dielectric mirror is made partially reflective for the electromagnetic radiation, and
   the lateral directions are aligned in parallel to the main extension plane of the semiconductor chip.

2. The method as claimed in claim 1, wherein the first structure predetermines a propagation direction for the electromagnetic radiation.

3. The method as claimed in claim 1, wherein the lateral surface of the first structure encloses an angle of 45°±1° with the first lateral surface of the semiconductor layer sequence.

4. The method as claimed in claim 1, wherein
   the semiconductor layer sequence comprises a first semiconductor area and a second semiconductor area,
   the first recess exposes the second semiconductor area, and
   the first structure is created on the exposed second semiconductor area.

5. The method as claimed in claim 1, wherein
   the semiconductor layer sequence is arranged on a substrate,
   the first recess completely penetrates the semiconductor layer sequence, and
   the first structure is created on an exposed substrate.

6. The method as claimed in claim 1, wherein
   the first structure comprises a dielectric material,
   an index of refraction of the first structure is less than an index of refraction of the semiconductor layer sequence.

7. The method as claimed in claim 1, wherein
   a dielectric layer is applied to the lateral surface of the first structure,
   an index of refraction of the dielectric layer is less than an index of refraction of the semiconductor layer sequence.

8. The method as claimed in claim 1, wherein
   a filler material is applied between the first structure and the semiconductor layer sequence, and
   an index of refraction of the filler material deviates by not more than n=0.2 from an index of refraction of the semiconductor layer sequence.

9. The method as claimed in claim 1, wherein a passivation layer is applied to the first lateral surface of the semiconductor layer sequence.

10. The method as claimed in claim 1, wherein the first structure has a shape of a triangle or trapezoid in cross section in a vertical direction.

11. The method as claimed in claim 10, wherein the semiconductor layer sequence is isolated to form the semiconductor chip by means of a cut in the vertical direction.

12. The method as claimed in claim 1 further comprising:
   creating a second recess in the semiconductor layer sequence, which completely penetrates the active area,
   creating a second structure in the second recess, wherein
   at least one lateral surface of the second structure facing toward the active area extends obliquely to at least one second lateral surface of the semiconductor layer sequence, the second structure is spaced apart in lateral directions from the active area, and the active area is arranged between the first recess and the second recess.

13. The method as claimed in claim 12, wherein a second dielectric mirror is applied over the second structure, the second dielectric mirror extends along the main extension plane, and the second dielectric mirror is made highly reflective for the electromagnetic radiation.

14. The method as claimed in claim 1, wherein the first dielectric mirror completely covers the first recess.

15. A radiation-emitting semiconductor chip comprising:

a semiconductor layer sequence comprising an active area designed to generate electromagnetic radiation, a first recess in the semiconductor layer sequence, which completely penetrates the active area, a first structure, which is arranged in the first recess, and a first dielectric mirror, which is arranged over the first structure, wherein at least one lateral surface of the first structure facing toward the active area extends obliquely to at least one first lateral surface of the semiconductor layer sequence, the first structure is spaced apart in lateral directions from the active area, the first dielectric mirror extends along a main extension plane of the semiconductor chip, the first dielectric mirror is made partially reflective for the electromagnetic radiation, and the lateral directions are aligned in parallel to the main extension plane of the semiconductor chip.

16. The radiation-emitting semiconductor chip as claimed in claim 15 further comprising:

a second recess in the semiconductor layer sequence, which completely penetrates the active area, a second structure in the second recess, wherein a lateral surface of the second structure facing toward the active area extends obliquely to a second lateral surface of the semiconductor layer sequence, the second structure is spaced apart in lateral directions from the active area, and the active area is arranged between the first recess and the second recess.

17. The radiation-emitting semiconductor chip as claimed in claim 15, wherein the semiconductor chip is a surface-emitting laser diode.

18. The radiation-emitting semiconductor chip as claimed in claim 15, wherein the semiconductor chip is a surface-emitting superluminescent diode.

19. A method for producing a radiation-emitting semiconductor chip comprising:

providing a semiconductor layer sequence comprising an active area, which is designed to generate electromagnetic radiation, creating a first recess in the semiconductor layer sequence, which completely penetrates the active area, creating a first structure in the first recess, and applying a first dielectric mirror over the first structure, wherein at least one lateral surface of the first structure facing toward the active area extends obliquely to at least one first lateral surface of the semiconductor layer sequence, the first structure is spaced apart in lateral directions from the active area, the first dielectric mirror extends along a main extension plane of the semiconductor chip, and the first dielectric mirror is made partially reflective for the electromagnetic radiation, wherein a dielectric layer is applied to the lateral surface of the first structure, wherein an index of refraction of the dielectric layer is less than an index of refraction of the semiconductor layer sequence and/or wherein a filler material is applied between the first structure and the semiconductor layer sequence, and an index of refraction of the filler material deviates by not more than $n=0.2$ from an index of refraction of the semiconductor layer sequence.

* * * * *